United States Patent [19]

Teuling

[11] 4,099,101
[45] Jul. 4, 1978

[54] CIRCUIT IN A TELEVISION DISPLAY APPARATUS FOR PRODUCING A SAWTOOTH DEFLECTION CURRENT THROUGH A LINE DEFLECTION COIL

[75] Inventor: Dirk Johan Adriaan Teuling, Eindhoven, Netherlands

[73] Assignee: U.S. Philips Corporation, New York, N.Y.

[21] Appl. No.: 739,070

[22] Filed: Nov. 5, 1976

[30] Foreign Application Priority Data

Nov. 11, 1975 [NL] Netherlands .......................... 7513160

[51] Int. Cl.² .......................... H01J 29/70; H01J 29/76
[52] U.S. Cl. ...................................... 315/408; 315/410
[58] Field of Search .......................... 315/408, 410, 399

[56] References Cited

U.S. PATENT DOCUMENTS

| 3,912,972 | 10/1975 | Otten et al. | 315/411 |
| 3,950,674 | 4/1976 | Joosten et al. | 315/408 |

FOREIGN PATENT DOCUMENTS 2,553,265  11/1975  Fed. Rep. of Germany ....... 315/408

Primary Examiner—Maynard R. Wilbur
Assistant Examiner—T. M. Blum
Attorney, Agent, or Firm—Frank R. Trifari; Henry I. Steckler

[57] ABSTRACT

A line deflection circuit in a television display apparatus. Between the parallel diode and the chassis there is a series arrangement of a first winding and a capacitor, a second winding being included between the switch and the voltage supply source. A diode is connected to a point of the first and to a point of the second winding and conducts in the retrace period of the deflection current. By adjusting the conduction time of the switch a trace voltage can be obtained which exceeds the supply voltage so that the circuit is suitable for battery supply.

7 Claims, 4 Drawing Figures

CIRCUIT IN A TELEVISION DISPLAY APPARATUS FOR PRODUCING A SAWTOOTH DEFLECTION CURRENT THROUGH A LINE DEFLECTION COIL

The invention relates to a circuit in a television display apparatus for producing a sawtooth deflection current through a line deflection coil which is part of a resonant network which also comprises a trace and a retrace capacitor and to which a first diode is in parallel, through which first diode the deflection current flows during a first part of the trace period whilst this current flows in the remaining, second part of the trace period through the series arrangement of a second diode and a controllable switch, which series arrangement is in parallel with the first diode, the conduction time of the switch being adjustable and the series arrangement of a winding of a first inductive element and a capacitor being in parallel with the first diode, to which first inductive element the deflection coil is coupled, whilst the junction of the second diode and the switch is connected through a winding of second inductive element to a terminal of a voltage supply source, the circuit comprising switching means for blocking any current in the second diode in the retrace period.

Such a circuit is known from U.S. Pat. No. 3,912,971. By adjusting the conduction time of the switch the trace voltage and consequently also the amplitude of the deflection current can be brought to a given value as a function of the supply voltage. Auxialiary supply voltages which are produced by the circuit are each adjusted, but not independent from one another, to a given value. For this purpose the transformation ratio of two windings of the second inductive element is also available as a parameter. For certain values thereof the blocking-switching means appear to be imperative as otherwise the retrace pulses would be cut off by the conducting second diode which would result in a distortion of the deflection current. These means consist, for example, of a fourth diode which is placed in series with said winding of the second inductive element.

It has appeared, however, that the desired trace voltage cannot be obtained for every value of the supply voltage, especially not if the supply voltage is lower than the desired value of the trace voltage. This is the case with television receivers which are fed by a battery. It is obvious that a higher supply voltage from the battery voltage can be obtained by means of a converter which raises the voltage, enabling the supply voltage thus obtained to supply energy to the deflection circuit. The advantages of the known circuit, namely the fact that only one switch is required and the self-stabilising operation thereof for the deflection current produced and for the auxiliary supply voltages produced are, however, lost. It is an object of the invention to provide a circuit which combines the advantages of a converter which supplies a high voltage (called "up converter" in English) with those of the known circuit and to that end the circuit according to the invention is characterized in that an electrode of a third diode is connected to a point of the first inductive element, the other electrode thereof being connected to the said terminal of the voltage supply source through a winding of the second inductive element, the winding sense of said winding and the direction of conduction of the third diode having being such that current can flow therethrough in the retrace period of the deflection current. In this respect it should be noted that the blocking means, for example a fourth dode, of the known circuit are only necessary with a given design thereof whilst in the circuit according to the invention they appear to be necessary in all circumstances.

The invention will be further explained by way of non-limitative example with reference to the accompanying figures in which FIG. 1 shows an embodiment of the circuit according to the invention, FIG. 2 shows waveforms occurring therein;

Figure 1:
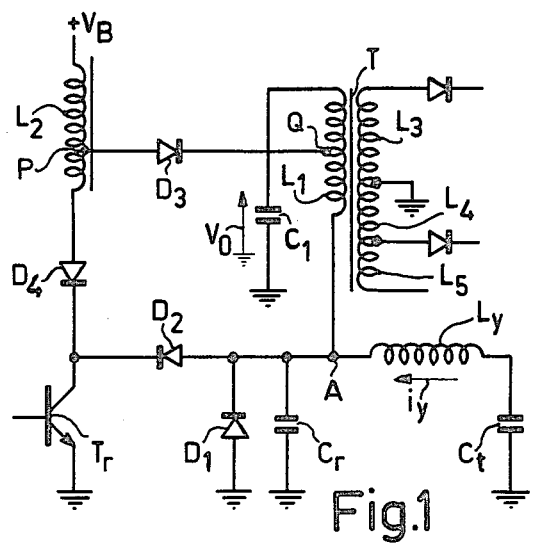

FIG. 1 only shows the most important components of the line deflection circuit of a television receiver not further shown. A deflection coil $L_y$, a trace capacitor $C_t$ and a retrace capacitor $C_r$ constitute a resonant network with which a diode $D_1$ is in parallel. Parallel to diode $D_1$ is the series arrangement of a diode $D_2$ and an npn transistor Tr, wherein the direction of conduction of the two diodes have been chosen such that diode $D_1$ conducts in the first half and diode $D_2$ in the second half of the trace time of the deflection current. The series arrangement of a winding $L_1$ and a capacitor $C_1$ is included between the junction point A of components $D_1$, $D_2$, $C_r$ and $L_y$ and chassis. The free ends of components $D_1$, $C_r$ and $C_t$ as well as the emitter of transistor Tr are connected to this same chassis. Through a choke coil $L_2$ and a diode $D_4$ the collector of transistor Tr is connected to the positive terminal of a power supply source which supplies a d.c. voltage $V_B$, the negative terminal of this voltage supply source being connected to chassis. The anode of a diode $D_3$ is connected to a tap P of coil $L_2$ and the cathode of diode $D_3$ is connected to a tap Q of winding $L_1$.

During the first half of the trace time diode $D_1$ conducts. The voltage across capacitor $C_t$ is applied to coil $L_y$ through which coil deflection current $i_y$ flows in the direction opposite to that of the arrow shown in FIG. 1. At the beginning of the trace time the transistor Tr is in the non-conducting state. There is a positive voltage at its collector and consequently diode $D_2$ is also non-conducting. At a given instant transistor Tr is made conductive by means of a pulse-shaped drive signal which is derived from a line oscillator, not shown. The collector current of transistor Tr flows through coil $L_2$ and diode $D_4$ whilst $D_2$ remains blocked as the anode voltage thereof, being the cathode voltage of diode $D_1$ is slightly more negative than the cathode voltage.

Approximately in the middle of the trace time current $i_y$ reverses its direction so that it now flows through diode $D_2$ and transistor Tr, whilst diode $D_1$ is rendered non-conducting. At the end of the trace time transistor Tr is cut off by means of the drive signal supplied to its base. An oscillation, the retrace pulse, is produced in a point A, whilst the energy stored in coil $L_2$ and which is derived from the source produces a current through diode $D_3$ which current compensates for the losses occurring in the circuit. At the end of the retrace time the voltage in point A becomes zero again, which renders $D_1$ conductive. This is the beginning of a new cycle. Diode $D_3$ remains conductive until transistor Tr is made conductive whereafter the current through diode $D_3$ is taken over by the collector current of transistor Tr. Current continues to flow through coil $L_2$ during the entire cycle so that the ripple current through the voltage source is low and produces few interferences.

Figure 2:
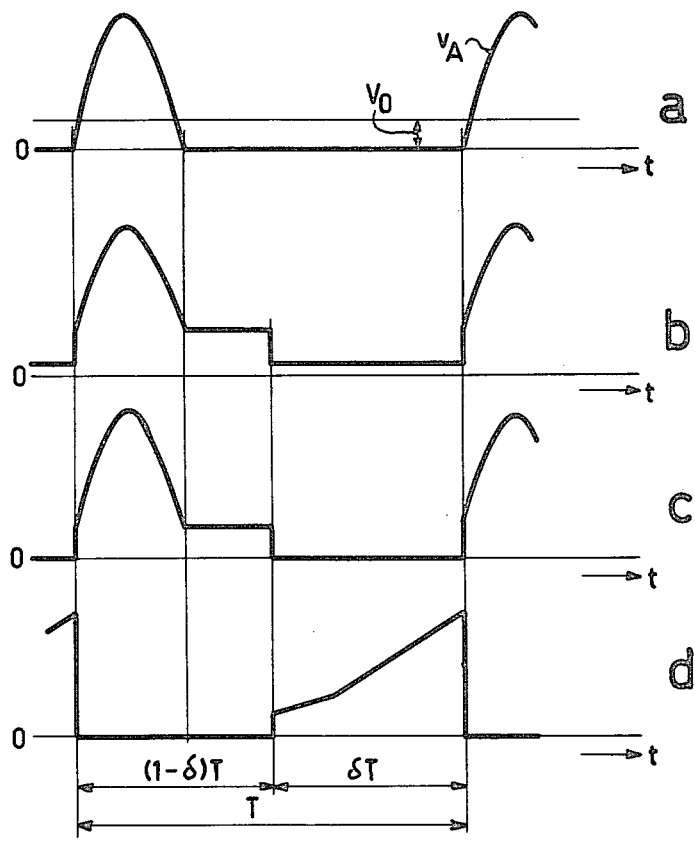

In FIG. 2a the voltage $v_A$ in point A, in FIG. 2b that in point P, in FIG. 2c the collector voltage of transistor Tr and in FIG. 2d the collector current of this transistor is plotted versus time. T indicates the line period, i.e. approximately 64 μs, whilst δT indicates the part of period T in which transistor Tr is conducting. From the above it appears that the shortest possible duration of δT is approximately equal to half the trace period and that the longest possible duration thereof is approximately equal to the entire trace period. If, for example, the duration of the retrace time is 20% of the period then the value of ratio δ is between 0.4 and 0.8.

A d.c. voltage $V_o$ is present across capacitor $C_1$. The d.c. voltage across capacitor $C_n$ or the d.c. voltage component of the trace voltage across it if the capacitor has a comparatively small capacitance for the so-called S-correction, is equal to voltage $V_O$. Also the average value of voltage $V_A$ is equal to $V_O$. If the value of voltage $V_B$ is known then a desired value can be given to voltage $V_O$, as a consequence of which also the amplitude of a current $i_y$ is given. For this three parameters are important, namely ratio δ, ratio 1:n of the number of turns of coil $L_2$ to the number of turns drawn above point P and the ratio 1:m of the number of turns of winding $L_1$ to the number of turns drawn above point Q.

The voltage at point Q is equal to $(1-m) V_O + mv_A$. The voltage at point P (see FIG. 2b) is equal to this voltage in the time $(1 - δ)T$ in which diode $D_3$ conducts and is equal to $(1 - n)V_B$ in the time δ T in which transistor Tr conducts. In the same time δ T the collector voltage of transistor Tr (see FIG. 2c) is substantially zero. In time $(1 - δ)T$ diodes $D_2$ and $D_4$ do not conduct. In that time the voltage at the interconnected cathodes thereof, consequently at the collector of transistor Tr assumes a value which is equal to the highest anode voltage: this is voltage $v_A$ during the retrace period. In the time interval after the retrace period and before transistor Tr becomes conductive this is the anode voltage of diode $D_4$: because the voltage at point P is in this interval equal to $(1 - m)V_O$ the collector voltage is equal to $(1 - m)V_O - (1 - n)V_B$.

The voltage across coil $L_1$ can be computed on the basis of these results. As the average value over one cycle of this voltage must be zero this results in an relation between voltage $V_O$ and $V_B$ as a function of the three parameters considered. This relation is:

$$V_O = \frac{1 - (1 - n)δ}{1 - (1 - m)δ} V_B \quad (1)$$

A certain value can be given to voltage $V_O$ by the choice of parameters m, n and δ. By means of a feedback and a pulse duration modulation of the pulses which drive the base of transistor Tr ratio δ can be adjusted in known manner in such a way that the value of voltage $V_O$ is independent of variations of voltage $V_B$. In the simple case that $n=1$ and $m=0$, in which the anode of diode $D_3$ is connected to the node of coil $L_2$ and diode $D_4$ and the cathode of diode $D_3$ to the node of winding $L_1$ and capacitor $C_1$ it applies:

$$V_O = \frac{V_B}{1 - δ}.$$

With $δ = 0.8$ it is obtained that $V_O = 5 V_B$.

From the above-mentioned general formula (1) it appears that $V_O$ and $V_B$ are equal to one another if $m = n$ which means that $V_O$ cannot be adjusted or controlled by means of δ. This occurs, for example, if $m = n = 1$, which is the case when diode $D_3$ is applied between point A and the node of coil $L_2$ and diode $D_4$. It is, consequently, clear that the circuit must satisfy yet another condition. This condition may be found by assuming the collector voltage of transistor Tr to be positive in the time interval after the retrace period and before the transistor becomes conducting. If this voltage is zero then a time variation of the base control has no influence and this voltage must not become negative as otherwise the collector-base diode of the transistor would become conductive. This leads to the condition that $(1-m)V_O$ must exceed $(1-n)V_B$. In this respect it may be mentioned that this condition is identical to the condition that diode $D_3$ must not conduct in time δT.

If in the condition found the value of $V_O/V_B$ of formula (1) is filled in then it is found that n must exceed m. From this it follows that $V_O$ always exceeds $V_B$. For this reason the circuit is suitable for use with a television receiver in which the supply voltage is low, for example a receiver fed by a battery. The ratio of $V_O$ to $V_B$ is larger according as n is larger than m and it can be proved that a variation range of voltage $V_B$ can be compensated for by a smaller variation range of ratio δ also according as n is larger than m.

Figure 3:
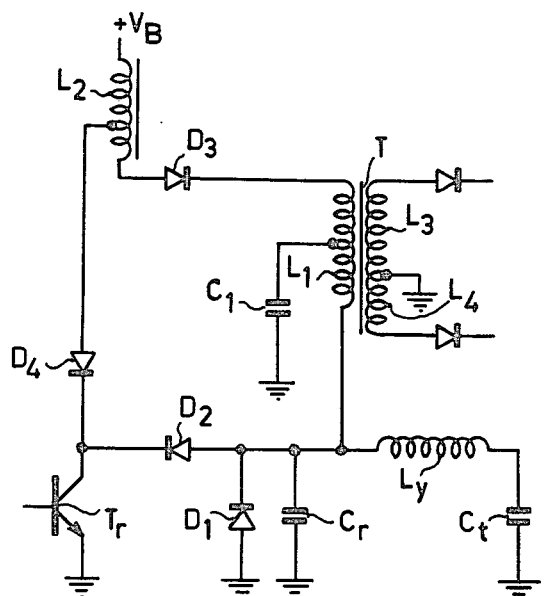
FIG. 3 shows a variant of the circuit of FIG. 1.

For these reasons it may be advantageous to choose n as large as possible, so larger than 1, and to choose m as low as possible, so negative. In this manner the circuit shown in FIG. 3 is obtained. Herein not the anode of diode $D_3$ but that of diode $D_4$ is connected to a tap of coil $L_2$ whilst not the cathode of diode $D_3$ but capacitor $C_1$ is connected to a tap of winding $L_1$. A restriction is, however, that both the denominator and the numerator in formula (1) must be positive which means that m must exceed $1 - 1/δ_{max}$, where $δ_{max}$ is the maximum value of δ. For example, if $δ_{max} = 0.8$ then m must exceed $-0.25$. As n exceeds m the condition is satisfied at the same time that the numerator must be positive.

With a negative value for m the value $n = 0$ is theoretically possible: In FIG. 1 the anode of diode $D_3$ is then connected to the voltage source. It is, however, obvious that such a circuit does not work in practice because the current flowing through coil $L_2$ cannot find a path during time δ T at the instant that transistor Tr is switched-off. It will also be appreciated that the mathematically theoretically possible condition that both the denominator and the numerator in formula (1) must be negative results in a circuit which cannot be realised in practice.

In connection with the consideration mentioned above it should be noted that diode $D_4$ is necessary in all circumstances, this in contradistinction to the diode in a similar place in the circuit described in the above-mentioned patent application, which diode is required in given rating cases only. For, the average value of the voltage in point P in FIG. 1 is $V_B$, whilst the average value of the voltage in point A is equal, to $V_O$. If diode $D_4$ would be missing then diodes $D_2$ and $D_3$ would be in parallel with one another with opposite directions of conductivity under the voltage $V_O - V_B$, which is not possible.

In practice both parts of inductors $L_1$ or $L_2$ may be constructed as two separate, interconnected windings. In the case of coil $L_2$ a winding is thus obtained between the positive terminal of the voltage source and diode $D_4$ on the one hand and a winding between the same terminal and diode $D_3$ on the other hand. Said first winding and diode $D_4$ may be interchanged, although the situation in which the winding is connected direct to a point of fixed potential should be preferred. The same applies to the second winding and diode $D_3$.

In FIGS. 1 and 3 winding $L_1$ is constructed as a primary winding of a transformer T whose two secondary windings $L_3$ and $L_4$ are shown in the drawing. Retrace pulses are produced which, after rectification, supply d.c. voltages for feeding other parts of the receiver. One of these voltages may be the high voltage for the final anode of the picture display tube. If voltage $V_O$ is stabilised then these voltages are stabilised too. The modulator (not shown in the drawing) in which the pulse duration modulation is effected in known manner is supplied with information about the value of voltage $V_O$, for example by means of a secondary winding $L_5$ of transformer T (see FIG. 1).

Figure 4:
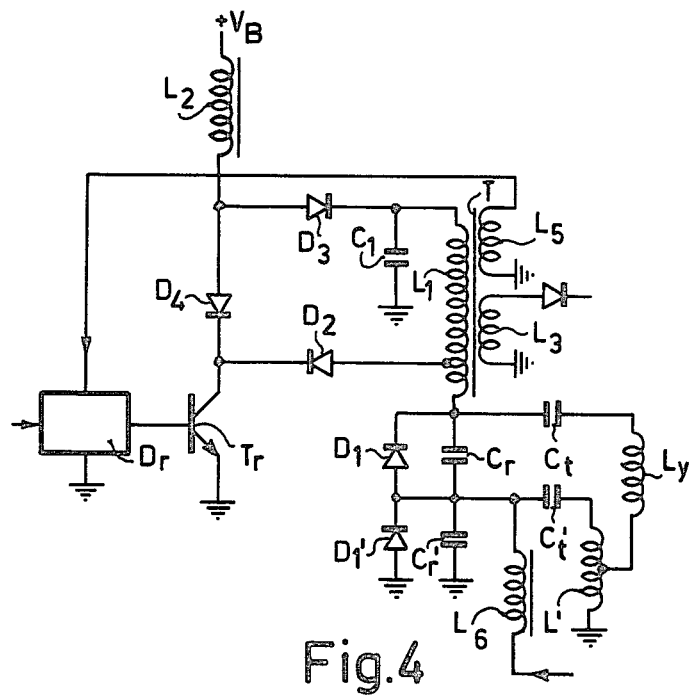
FIG. 4 shows an embodiment of the circuit according to the invention suitable for a colour television receiver.

FIG. 4 shows an embodiment of the circuit according to the invention which is suitable for a colour television receiver. Herein the network $D_1$, $C_r$, $L_y$, $C_t$ and a second, similar network $D_1'$, $C_r'$, $L'$, $C_t'$ are arranged in a manner which is further described in U.S. Pat. No. 3,906,305. A parabolic signal of field frequency is supplied through a coil $L_6$ whereby the line deflection current is submitted to the so-called east-west modulation. In this circuit $m = 0$ and $n = 1$ which offers the advantage that no leakage inductances are present so that currents may vary in a transient manner without causing disturbances. Winding $L_5$ is fed back to the driver stage Dr which drives the base of transistor Tr. In known manner coil $L_2$ may be a winding of transformer T. The linearity is improved because the anode of diode $D_2$ is connected to a tap of winding $L_1$. It is obvious that diode $D_2$ or $D_4$ may be replaced by a transistor. In a practical embodiment of the circuit according to the invention voltage $V_O$ is approximately 36 V for a nominal value of the battery voltage $V_B$ of 12 V, so that the nominal value of ratio $\delta$ is approximately 0.67. The self induction value of coil $L_y$ is approximately 430 $\mu$H.

What is claimed is:

1. A circuit for producing a sawtooth deflection current having trace and retrace periods through a line deflection coil from a supply voltage source, said circuit comprising a trace capacitor and a retrace capacitor both adapted to be coupled to said coil to form a resonant network therewith, a first diode means coupled in parallel with said network for conducting the deflection current during a first part of the trace period, means for conducting said deflection current during a second part of the trace period including a first series arrangement including a second diode and a controllable switch, said first series arrangement being coupled in parallel with the first diode, the conduction time of the switch being adjustable and a second series arrangement including a winding of a first inductive element and a capacitor coupled in parallel with the first diode, said first inductive element adapted to be coupled to the deflection coil, a winding of a second inductive element direct current coupled between the junction of the second diode and the switch and to a terminal of said voltage supply source, switching means coupled to said second diode for blocking any current in the second diode in the retrace period, and a third diode having a first electrode connected to a point of the first inductive element, and a second electrode direct current connected to said terminal of the voltage supply source through said winding of the second inductive element, the winding sense of said winding of said second inductive element and the direction of conductivity of the third diode being such that current can flow therethrough in the retrace period of the deflection current.

2. A circuit as claimed in claim 1, wherein the ratio $m$ of the number of turns of the winding of the first inductive element between the capacitor and the third diode to the number of turns between the capacitor and the first diode is smaller than the ratio $n$ of the number of turns of the winding of the second inductive element between the terminal of the supply voltage source and the third diode to the number of turns between said terminal and the switching means.

3. A circuit as claimed in claim 1, wherein the ratio $n$ of the number of turns of the winding of the second inductive element between the terminal of the voltage supply source and the third diode to the number of turns between said terminal and the switching means differs from zero.

4. A circuit as claimed in claim 1, wherein the ratio $m$ of the number of turns of the winding of the first inductive element between the capacitor and the third diode to the number of turns between the capacitor and the first diode exceeds $1 - 1/\delta_{max}$, wherein $\delta_{max}$ is the maximum possible value of the ratio $\delta$ of the time interval in which the switching means conducts to the entire line period.

5. A circuit as claimed in claim 2, wherein $m = 0$ and $n = 1$.

6. A circuit as claimed in claim 1 wherein the first and the second inductive element have one common core.

7. A television display apparatus comprising a circuit as claimed in claim 1.

* * * * *